United States Patent
Chuang et al.

(10) Patent No.: US 7,177,177 B2
(45) Date of Patent: Feb. 13, 2007

(54) BACK-GATE CONTROLLED READ SRAM CELL

(75) Inventors: Ching-Te Kent Chuang, South Salem, NY (US); Jae-Joon Kim, Yorktown Heights, NY (US); Keunwoo Kim, Somers, NY (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 11/100,893

(22) Filed: Apr. 7, 2005

(65) Prior Publication Data
US 2006/0227595 A1 Oct. 12, 2006

(51) Int. Cl.
G11C 11/00 (2006.01)
(52) U.S. Cl. ............. 365/154; 365/230.01; 365/185.01
(58) Field of Classification Search ................ 365/154, 365/230.01, 185.01
See application file for complete search history.

(56) References Cited

U.S. PATENT DOCUMENTS

| | | | |
|---|---|---|---|
| 6,078,544 A | 6/2000 | Park | |
| 6,576,962 B2 | 6/2003 | Rockett | |
| 6,654,277 B1 | 11/2003 | Hsu et al. | |
| 6,816,401 B2 | 11/2004 | Kauffmann et al. | |
| 2002/0006072 A1* | 1/2002 | Kunikiyo | 365/230.05 |
| 2005/0169054 A1* | 8/2005 | Forbes | 365/185.08 |

* cited by examiner

Primary Examiner—Richard Elms
Assistant Examiner—N Nguyen
(74) Attorney, Agent, or Firm—Scully, Scott, Murphy & Presser, P.C.; Rafael Perez-Pineiro, Esq.

(57) ABSTRACT

An eight transistor static random access memory (SRAM) device includes first and second inverters, a first bit line, a first complement bit line, a pair of write access transistors, and a pair of read access transistors. Each of the first and second inverters includes a respective pair of transistors, and has a respective data node. Each of a first and a second of the access transistors has a source, a drain, a front gate, and a back gate. The first access transistor is coupled to the first bit line, and the second access transistor is coupled to the first complement bit line. The back gate of the first access transistor is coupled to the data node of the first inverter; and the back gate of the second access transistor is coupled to the data node of the second inverter. This increases the difference between the threshold voltages of the first and second access transistors.

23 Claims, 5 Drawing Sheets

8T Back-Gate Controlled SRAM Cell

Conventional 6T SRAM Cell

10T SRAM Cell

8T SRAM Cell (Single-End READ)

Conventional 6T SRAM Cell

FIG. 5
8T Back-Gate Controlled SRAM Cell
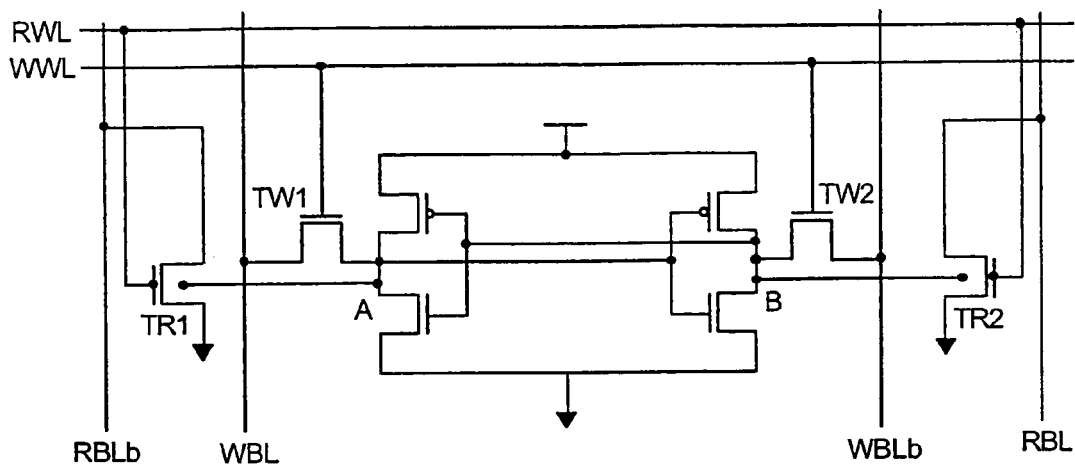
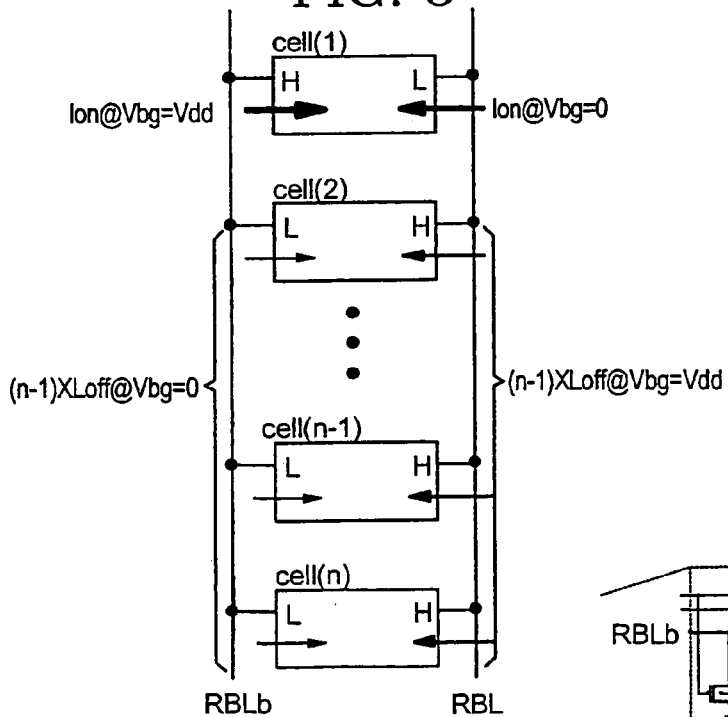
FIG. 6
FIG. 6A
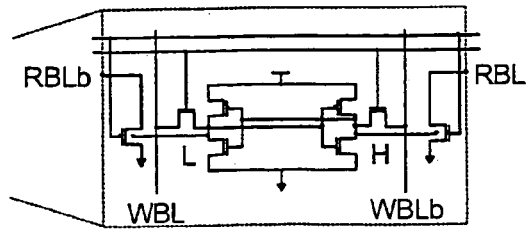

Applying negative voltage to read word line in stand-by mode to reduce the leakage 8T Back-Gate Controlled SRAM Cell (merged WBL/RBL)

SNM comparison between the conventional 6T SRAM cell and the proposed 8T back-gate controlled READ SRAM Cell

BACK-GATE CONTROLLED READ SRAM CELL

This invention was made with Government support under Contract No.: (NBCH3039004) awarded by (DARPA). The Government has cetain rights in this invention.

BACKGROUND OF THE INVENTION

1. Field of the Invention

This invention generally relates to static random access memory (SRAM) devices; and more specifically, the invention relates to a back gate controlled SRAM device.

2. Background Art

An SRAM is a semiconductor device that allows data to be stored in a static manner—that is, in a manner that does not require any refresh cycles to maintain the stored data—and SRAMs are now a key component in microelectronic chips/applications. As the dimension of semiconductor technology scales down, the process variations including random doping fluctuation would be the crucial factor of the SRAM design. When large process variation for aggressively scaled device dimension occurs, threshold voltages of two neighbor transistors in a conventional 6-transistor (6T) SRAM cell, as shown in FIG. 1, can be significantly different and the stability of SRAM cell deteriorates. The stability of a SRAM cell is often quantified by the static noise margin (SNM). The reduction of SNM threatens reliable functionality of SRAM, and, as a result, it may hinder the scaling of SRAM cell size in the future semiconductor technology to ensure the correct memory function. While the use of a large SRAM cell gives higher stability so that it is possible to maintain correct memory read and write functionalities, the area penalty due to the large SRAM cell size is intolerable. Since SRAM cell arrays consume most of the area in the modern microprocessor chip, design of a small SRAM cell is crucial for the design of very large scale integration (VLSI) systems.

One way to increase stability of SRAM is the use of 10-transistor (10T) SRAM cell, as illustrated in FIG. 2, instead of the conventional 6-transistor (6T) SRAM cell, shown in FIG. 1. In 10T SRAM cell, the cell node voltages are decoupled from the bit lines in READ mode so that the cell node voltages are not disturbed by the READ current. Hence, degradation of SNM in READ mode does not occur while the SNM in READ mode of conventional 6T SRAM is worse than SNM in STAND-BY mode. The 10T SRAM cell design approach also has large area consumption problem due to the increased number of transistors in a cell (from 6 to 10) although it is scalable to future technologies.

8-Transistor (8T) SRAM cell, as shown in FIG. 3, is an alternative to 10T SRAM cell. 2 transistors from 10T SRAM cell are removed in 8T SRAM cell by cutting down one of the differential bit lines. As the result, the 8T SRAM cell has the single-ended READ path while 10T SRAM cell has differential bit lines for READ operations. Although the 8T SRAM cell has the smaller area than the 10T SRAM cell has, single-end sensing scheme requires the higher bit line voltage development for correct sensing and it may limit the number of cells per sense amplifier. Hence, the area of 8T SRAM array may not be smaller than 10T SRAM array in system perspective.

SUMMARY OF THE INVENTION

An object of this invention is to improve SRAM cells.

Another object of the present invention is to provide a new eight transistor SRAM cell structure which maintains advantages of ten transistor SRAM cells while reducing the area overhead.

A further object of the invention is to improve the read stability of a SRAM cell and to reduce the number of transistors in the cell using a back gate (or body) controlled read path.

These and other objectives are attained with an eight transistor static random access memory (SRAM) device, comprising first and second inverters, a first bit line, a first complement bit line, a pair of write access transistors, and a pair of read access transistors. Each of the first and second inverters includes a respective pair of transistors, and has a respective data node. Each of a first and a second of the access transistors has a source, a drain, a front gate, and a back gate. The first access transistor is coupled to the first bit line, and the second access transistor is coupled to the first complement bit line. The back gate of the first access transistor is coupled to the data node of the first inverter; and the back gate of the second access transistor is coupled to the data node of the second inverter. This increases the difference between the threshold voltages of the first and second access transistors.

The preferred embodiment of the invention, described in detail below, has a number of important advantages over previous known solutions. For instance, SRAM cells embodying this invention can have higher stability than the conventional six transistor SRAM, and the SRAM structure of the present invention has the smaller number of transistors than ten transistor SRAM while maintaining the same stability. Further, the present invention can use small differential bit line voltage split while the previous eight transistor SRAM uses single-ended bit line with large voltage swing. In addition, the preferred embodiment of this invention can be used in the future technology where the stability is hard to manage due to the process variations. This invention can also be used to reduce the area of multi-port register file design.

Further benefits and advantages of the invention will become apparent from a consideration of the following detailed description, given with reference to the accompanying drawings, which specify and show preferred embodiments of the invention.

BRIEF DESCRIPTION OF THE DRAWINGS

FIG. 5 depicts an eight transistor SRAM cell designed in accordance with the present invention.

FIGS. 6 and 6A illustrates a worst case scenario for read operation in an eight transistor SRAM of this invention.

DETAILED DESCRIPTION OF THE PREFERRED EMBODIMENTS

Figure 1:
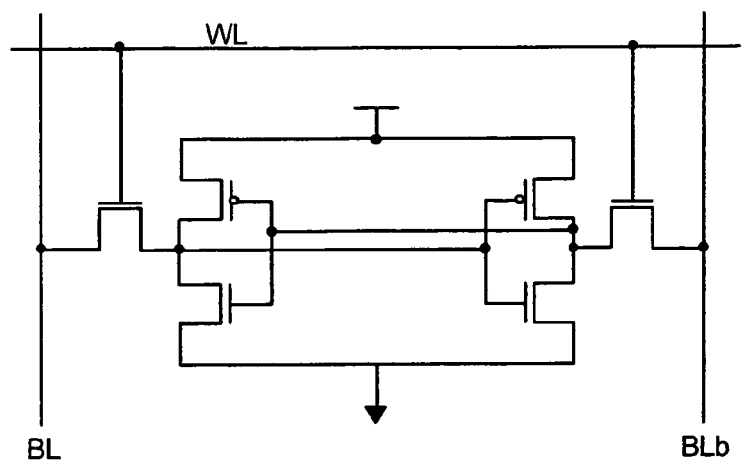
FIG. 1 shows a conventional six transistor SRAM cell.
Figure 2:
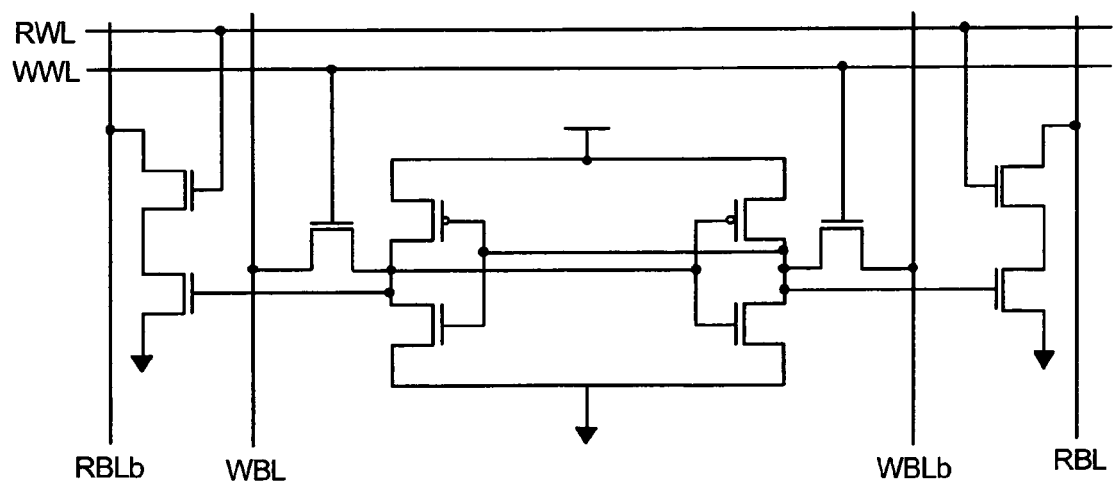
FIG. 2 illustrates a prior art ten transistor SRAM cell.
Figure 3:
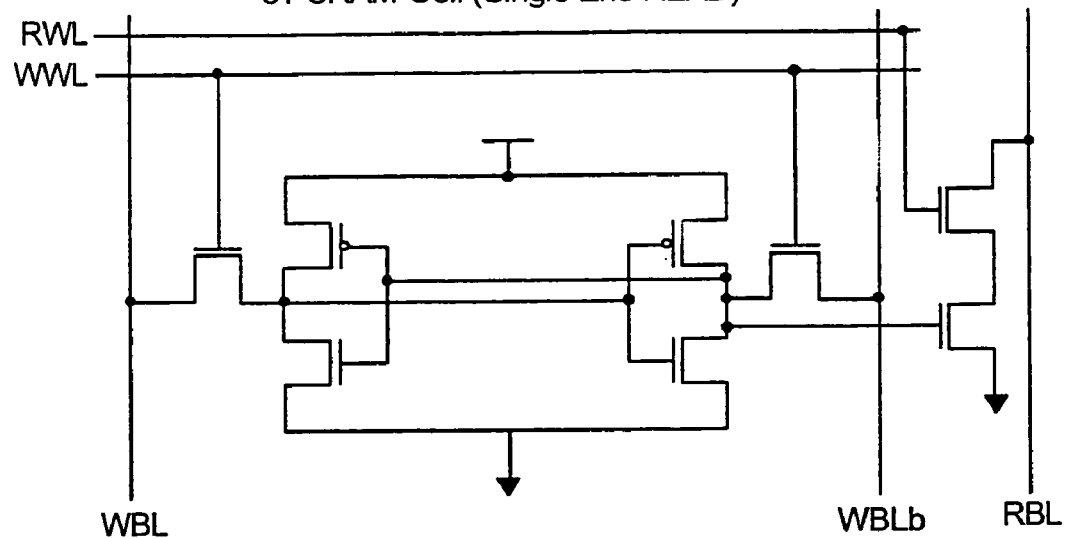
FIG. 3 shows a prior art eight transistor SRAM cell.
Figure 4:
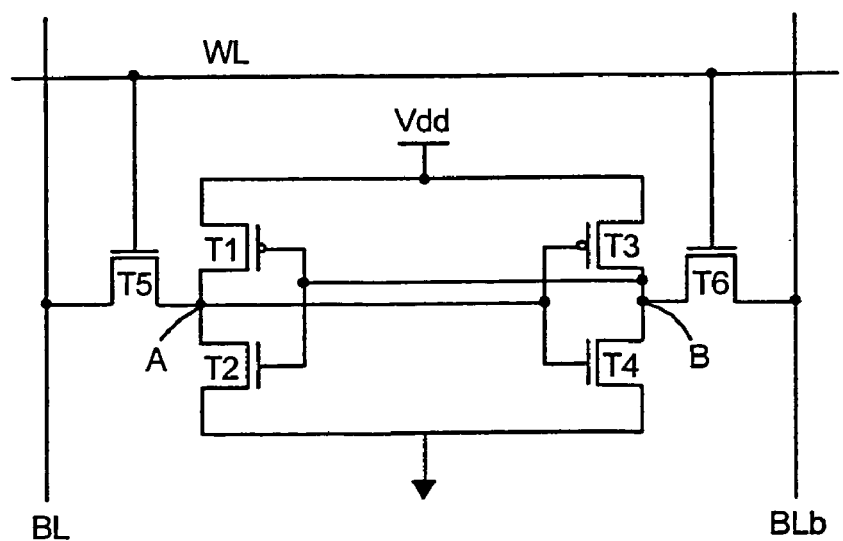
FIG. 4 also shows a standard six transistor SRAM cell.

FIG. 4 illustrates a standard CMOS static RAM cell defined by six MOS transistors T1, T2, T3, T4, T5, and T6; of these transistors, transistors T1 and T2 are PMOS transistors while the remaining transistors are of the NMOS type. Transistors T1 and T3 are serially connected between Vdd and ground to form a first inverter with a data node A between the two transistors, and, in a similar manner, transistors T2 and T4 are likewise connected between Vdd and ground to form a second inverter with a data node B therebetween. The gates of the transistors of each inverter are connected together and cross-coupled to the data node of the other inverter. The transistor T5 is connected between the bit line BL and the data node A to provide data access thereto, and the transistor T6 is connected between the complementary bit line BLb and the data node B to similarly provide data access. The gates of the data access transistors T5 and T6 are connected to respective word lines WL; ancillary circuitry including differential-input sense amplifiers are not shown in FIG. 4.

The cross-coupled inverters of the memory cell of FIG. 4 have two stable states functioning to store either a binary one or a binary zero. More specifically, the data access transistors T5 and T6 are gated into conduction by an appropriate voltage applied to the respective word lines WL while a binary high is impressed on data node A via the bit line BL and a binary low is impressed on the complementary bit line BLb. The transistor T4 conducts to pull the data node B toward ground (binary low) while the data node A goes high. The opposite data state can be achieved by reversing the signals applied to the bit lines BL and BLb.

As discussed earlier, it would be desirable to provide an SRAM structure that is more stable than the conventional six transistor SRAM structure but which has a smaller area than the standard ten transistor SRAM structure. The present invention does this, and FIG. 5 shows an embodiment of the invention that achieves this result.

In the embodiment of FIG. 5, the cell storage nodes (A and B) are connected to the back gate (or body) of READ access transistors TR1 and TR2. For example, the cell node A has "High" logic value and the node B has "Low" logic value in STAND-BY mode. In this case, the back gate (or body) voltage of TR1 is "High" and that of TR2 is "Low". Due to the difference of back-gate (or body) voltages, TR1 and TR2 have different values of threshold voltages. Since the voltages at "A" are higher than the voltage at "B", TR1 has the lower threshold voltage than TR2 has, and hence the on-current (Ion) of TR1 is higher than Ion of TR2. In the READ mode, the RWL is energized and READ transistors TR1 and TR2 are turned-on. Consequently, currents from the precharged READ bit lines RBLb and RBL start to flow through TR1 and TR2. Since Ion(TR1) is larger than Ion (TR2), the voltage drop at RBLb is higher than the voltage drop at RBL. A sense-amplifier (not shown) senses the difference between the two bit lines and completes the READ operation.

To better understand the operation and advantages of the present invention, it may be helpful to discuss a more rigorous condition for a worst case READ in terms of functionality. FIGS. 6 and 6A show this worst case for READ operation.

In this example, the number of cells per bit line is n and the cell(1) is accessed in the READ mode without loss of generality. In the READ mode, on-current flows through access transistors of cell(1) and the on-current($I_{on}$) from RLBb to cell(1) is higher than that from RLB as explained above. When the cell(1) is accessed, the read word line (RWL) of the other cells (cell(2)–cell(n)) has zero voltage so that only leakage current flows through READ access transistors of cell(2)–(n). For correct READ functionality in FIG. 6, the sum of each current from RBLb must be always larger than the current from RBL. In the worst case, every cell except cell(1) has logic value different from the logic value of cell(1) as shown in FIG. 6 because the off-current ($I_{off}$) of a transistor with high back-gate voltage is much larger than the off-current of a transistor with low back-gate voltage. Hence, devices must be designed to satisfy the following condition.

$$I_{on}@(V_{bg}=V_{dd})+(n-1)\times I_{off}@(V_{bg}=0)>I_{on}@(V_{bg}=0)+(n-1)\times I_{off}@(V_{bg}=V_{dd})$$

Figure 7:
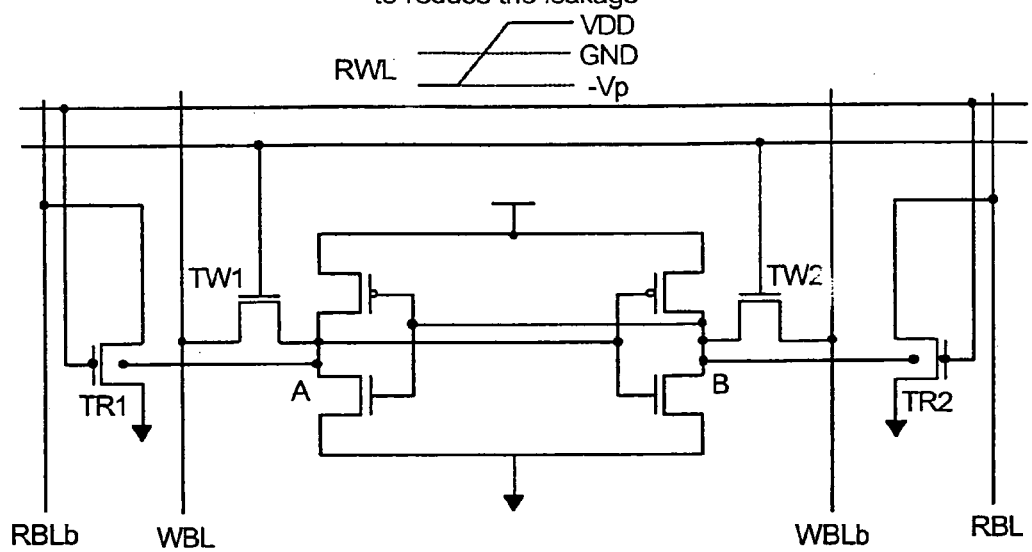
FIG. 7 shows an example of the present invention in which a negative voltage is applied to the read word line.

The large off-current of the device with high back-gate voltage does not only cause a potential problem in functionality but also increases the stand-by power. Hence, preferably negative voltage is applied to the read word line (RWL) to reduce the off-current through the access transistors when cells are not accessed as shown in FIG. 7. Since the sub-threshold current exponentially depends on gate-voltage, the leakage power can be substantially reduced by applying the negative voltage to the gate of access transistors in stand-by mode.

The WRITE operation principle is the same as the conventional SRAM cells. In WRITE mode, WRITE transistors TW1 and TW2 are turned on and the logic values at the WRITE bit lines WBL and WBLb are transferred to the cell nodes A and B. In FIG. 6, READ bit lines and WRITE bit lines are separated, and hence simultaneous READ and WRITE is possible. This structure is also applicable to multi-port SRAM array to reduce the area overhead in the conventional design.

Figure 8:
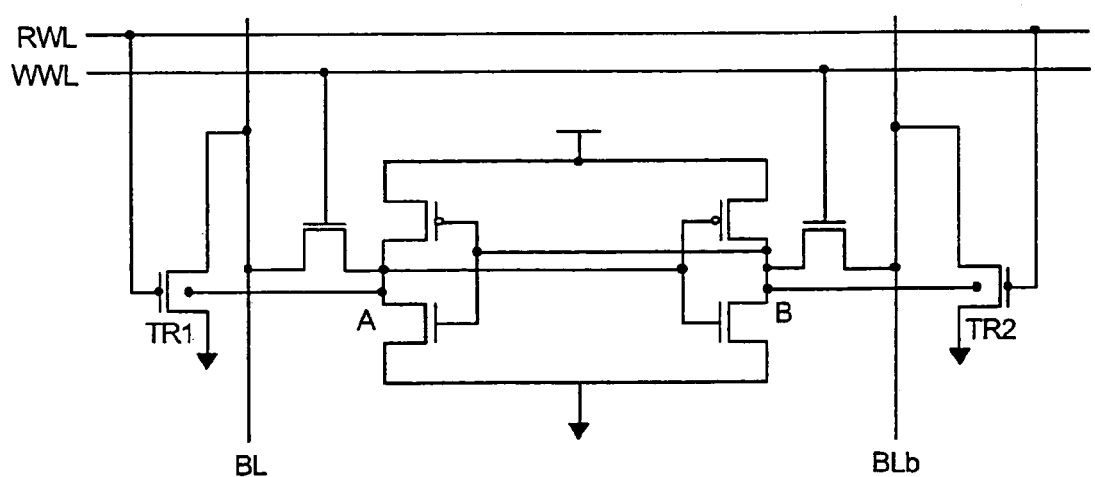
FIG. 8 depicts an embodiment of the invention having merged write and read bit lines.

It is possible to merge READ bit lines and WRITE bit lines to further reduce the cell area if bit pitch should be increased to adopt the two separate READ/WRITE bit lines as shown in FIG. 8. In this case, simultaneous READ/WRITE is not possible anymore instead.

To implement the proposed back-gate controlled SRAM cell, independent back-gate (or body) control is preferred. The possible device options include but are not limited to bulk MOSFETs with isolated body, silicon-on-insulator (SOI) MOSFETs with body contacts or back gate, and double gate MOSFETs including FinFET and Trigate with independent front and back gates. For example, if this scheme is applied to asymmetrical double-gate technology with n+ polysilicon for front gate and p+ polysilicon for back gate in n-type MOSFET, or double-gate device with different metal gate materials (or work functions) for front and back gates, or the combination of polysilicon and metal gate for front and back gates, Ion for TR1 would be much higher than Ion for TR2 since the forward-biased back gate for TR1 significantly reduces the threshold voltage for the front channel.

Figure 9:
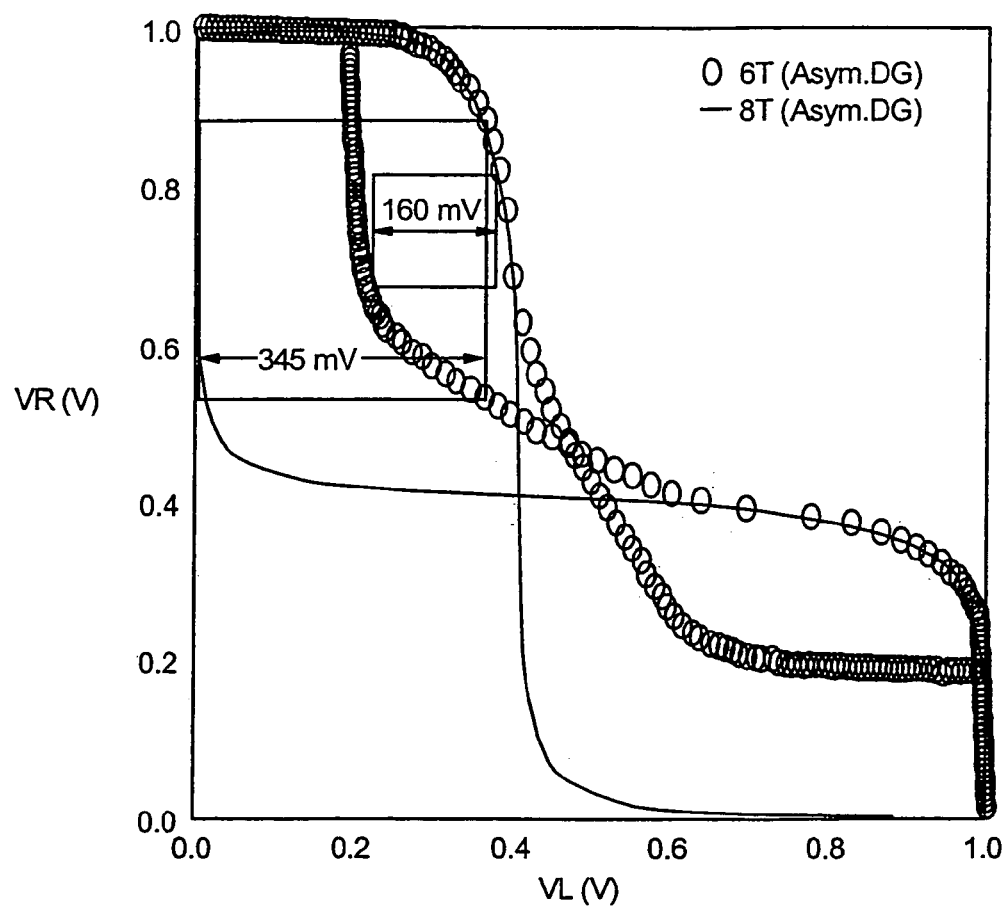
FIG. 9 shows a comparison between a conventional six transistor SRAM and an eight transistor SRAM embodying the present invention.

FIG. 9 shows a comparison of SNM results from numerical device simulation between the conventional 6T SRAM cell and an 8T SRAM embodying the present invention and using asymmetric double gate transistors. As can be seen, the SRAM designed in accordance with this invention has significantly higher SNM than that of the conventional SRAM cell.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A static random access memory (SRAM) device, comprising:
   first and second inverters, each of the first and second inverters having a respective data node;
   a first bit line, and a first complement bit line;
   first and second access transistors, each of the first and second access transistors having a source, a drain, a front gate, and a back gate;
   means coupling the first access transistor to the first bit line, and means coupling the second access transistor to the first complement bit line;
   means coupling the back gate of the first access transistor to the data node of the first inverter; and
   means coupling the back gate of the second access transistor to the data node of the second inverter to increase the difference between the threshold voltages of the first and second access transistors.

2. A static random access memory device according to claim 1, wherein:
   the first bit line is a first read bit line; and
   the first complement bit line is a first complement read bit line.

3. A static random access memory device according to claim 2, further comprising a read word line; and wherein the gates of the first and second access transistors are connected to the read word line.

4. A static random access memory device according to claim 1, further comprising:
   a first write bit line and a first complement write bit line;
   a first write access transistor coupled between the first write bit line and the first inverter; and
   a second write access transistor coupled between the first complement write bit line and the second inverter.

5. A static random access memory device according to claim 1, wherein:
   the first bit line is a merge read/write bit line;
   the first complement bit line is a merged complement read/write bit line; and
   further comprising:
   a first write access transistor coupled between the merged read/write bit line and the first inverter; and
   a second write access transistor coupled between the merged complement read/write bit line and the second inverter.

6. A static random access memory device according to claim 1, wherein the first and second access transistors are selected from the group comprising:
   bulk MOSFETs with isolated body;
   Silicon-on-insulator (SOI) MOSFETs with body contacts or back gate; and
   double gate MOSFETs, including FinFET and Trigate with independent front and back gates.

7. A static random access memory device according to claim 1, wherein:
   the front gates of the first and second access transistors are comprised of a n+ polysilicon; and
   the back gates of the first and second access transistors are comprised of a p+ polysilicon.

8. A static random access memory (SRAM) array, comprising:
   a first bit line, and a first complement bit line; and
   a multitude of SRAM devices, each of the SRAM devices including
   i) first and second inverters, each of the first and second inverters having a respective data node,
   ii) first and second access transistors, each of the access transistors having a source, a drain, a front gate, and a back gate,
   iii) means coupling the first access transistor to the first bit line, and means coupling the second access transistor to the first complement bit line,
   iv) means coupling the back gate of the first access transistor to the data node of the first inverter; and
   v) means coupling the back gate of the second access transistor to the data node of the second inverter to increase the difference between the threshold voltages of the first and second access transistors.

9. An SRAM array according to claim 8, wherein said SRAM devices are arranged in a sequence and said array satisfies the following condition:

$$I_{on}@(V_{bg}=V_{dd})+(n-1)\times I_{off}@(V_{bg}=0) > I_{on}@(V_{bg}=0)+(n-1)\times I_{off}@(V_{bg}=V_{dd})$$

where
   $I_{on}@(V_{bg}=V_{dd})$ is the on current through the first access transistor of the first in the sequence of SRAM devices, when the first node of said first SRAM device has a high value;
   n is the number of SRAM devices in the sequence;
   $(n-1)\times I_{off}@(V_{bg}=0)$ is the sum of the leakage currents through the first access transistors of the second through n SRAMS in the sequence when the first node of each of these second through n SRAMs has a low value;
   $I_{on}@(V_{bg}=0)$ is the on current through the second access transistor of the first in the sequence of SRAMs when the first node of said first SRAM is low; and
   $(n-1)\times I_{off}@(V_{bg}=V_{dd})$ is the sum of the leakage currents through the second access transistors of the second through n SRAMs in the sequence when the second node of each of these second thorough n SRAMs has a high value.

10. An SRAM array according to claim 9, wherein:
    the first bit line is a first read bit line; and
    the first complement bit line is a first complement read bit line.

11. An SRAM array according to claim 9, further comprising:
    a first write bit line and a first complement write bit line;
    a first write access transistor coupled between the first write bit line and the first inverter; and
    a second write access transistor coupled between the first complement write bit line and the second inverter.

12. An SRAM array according to claim 9, wherein the first and second access transistors are selected from the group comprising:
    bulk MOSFETs with isolated body;
    silicon-on-insulator (SOI) MOSFETs with body contacts or back gate; and
    double gate MOSFETs, including FinFET and Trigate with independent front and back gates.

13. An SRAM array according to claim 9, wherein:
    the front gates of the first and second access transistors are comprised of a n+ polysilicon; and
    the back gates of the first and second access transistors are comprised of a p+ polysilicon.

14. A method of operating a static random access memory (SRAM) device, the SRAM device having first and second inverters, a first bit line and a first complement bit line, each of the first and second inverters having a respective data node, the method comprising the steps of:
providing first and second access transistors, each of the first and second access transistors having a source, a drain, a front gate, and a back gate;
coupling the first access transistor to the first bit line, and coupling the second access transistor to the first complement bit line;
coupling the back gate of the first access transistor to the data node of the first inverter; and
coupling the back gate of the second access transistor to the data node of the second inverter to increase the difference between the threshold voltages of the first and second access transistors.

15. A method according to claim 14, comprising the further steps of:
providing a read word line; and
coupling the gates of the first and second access transistors to the read word line.

16. A method according to claim 14, comprising the further steps of:
providing a first write bit line and a first complement write bit line;
providing first and second write access transistors;
coupling the first write access transistor between the first write bit line and the first inverter; and
coupling the second write access transistor between the first complement write bit line and the second inverter.

17. A method according to claim 14, wherein:
the first bit line is a first read bit line; and
the first complement bit line is a first complement bit line.

18. A method according to claim 14, wherein:
the first bit line is a merge read/write bit line;
the first complement bit line is a merged complement read/write bit line; and
comprising the further steps of:
coupling a first write access transistor between the merged read/write bit line and the first inverter; and
coupling a second write access transistor between the merged complement read/write bit line and the second inverter.

19. A method according to claim 14, wherein the first and second access transistors are selected from the group comprising:
bulk MOSFETs with isolated body;
silicon-on-insulator (SOI) MOSFETs with body contacts or back gate; and
double gate MOSFETs, including FinFET and Trigate with independent front and back gates.

20. A method according to claim 14, wherein:
the front gates of the first and second access transistors are comprised of a n+ polysilicon; and
the back gates of the first and second access transistors are comprised of a p+ polysilicon.

21. A static random access memory (SRAM) device, comprising:
first and second inverters, each of the first and second inverters having a respective data node;
a first read bit line, and a first complement read bit line;
first and second read access transistors, each of the first and second read access transistors having a source, a drain, a front gate, and a back gate;
means coupling the first read access transistor to the first read bit line, and means coupling the second read access transistor to the first complement read bit line;
means coupling the back gate of the first read access transistor to the data node of the first inverter to apply the voltage of the data node of the first inverter to the back gate of the first read access transistor; and
means coupling the back gate of the second read access transistor to the data node of the second inverter to apply the voltage of the data node of the second inverter to the back gate of the second read access transistor to increase the difference between the threshold voltages of the first and second read access transistors and thereby increase the stability of the SRAM.

22. A static random access memory device according to claim 21, further comprising:
a read word line, and wherein the gates of the first and second access transistors are connected to the read word line;
a first write bit line and a first complement write bit line;
a first write access transistor coupled between the first write bit line and the first inverter; and
a second write access transistor coupled between the first complement write bit line and the second inverter.

23. A static random access memory device according to claim 21, wherein:
the first and second read access transistors are selected from the group comprising:
i) bulk MOSFETs with isolated body,
ii) silicon-on-insulator (SOI) MOSFETs with body contacts or back gate, and
iii) double gate MOSFETs, including FinFET and Trigate with independent front and back gates;
the front gates of the first and second read access transistors are comprised of a n+ polysilicon; and
the back gates of the first and second read access transistors are comprised of a p+ polysilicon.

* * * * *